United States Patent [19]

Sherman et al.

[11] Patent Number: 4,568,834
[45] Date of Patent: Feb. 4, 1986

[54] HIGH VOLTAGE SOLID STATE MULTIPLEXER

[75] Inventors: Jeffrey D. Sherman, Billerica; Stephen E. Courcy, Westford, both of Mass.

[73] Assignee: The United States of America as represented by the Secretary of the Army, Washington, D.C.

[21] Appl. No.: 528,837

[22] Filed: Sep. 2, 1983

[51] Int. Cl.⁴ ............... H03K 17/693; H04J 3/02
[52] U.S. Cl. ............... 250/551; 307/243; 307/311; 307/580; 328/104; 370/112
[58] Field of Search ............... 250/227, 551; 307/243, 307/244, 311, 580, 584, 585; 328/104, 105, 152–154, 2; 370/112

[56] References Cited

U.S. PATENT DOCUMENTS 3,639,781 2/1972 Marley ............... 370/112
4,390,790 6/1983 Rodriguez ............... 307/311

Primary Examiner—Edward P. Westin
Attorney, Agent, or Firm—Anthony T. Lane; Jeremiah G. Murray; Edward Goldberg

[57] ABSTRACT

A high voltage multiplexer comprising as the switching elements for each channel thereof a pair of series connected double diffused metal oxide semiconductor transistors connected source-to-source to obtain very high 'off' resistance, with optical links comprising LEDs to switch the pairs of transistors 'on' and 'off'. A logic chip controls the switching of the transistors in accordance with externally applied signals. Circuitry is provided for rapidly discharging any voltage remaining on the gate-to-source capacity of the series-connected transistors upon the switching 'off' of any channel.

6 Claims, 4 Drawing Figures

HIGH VOLTAGE SOLID STATE MULTIPLEXER

The Government has rights in this invention pursuant to Contract DAAE07-81-C-4022, awarded by the Department of the Army.

BACKGROUND OF THE INVENTION

This invention relates to a multiplexer and more particularly to a multiplexer which is capable of selectively connecting one of a plurality of signals or channels on separate leads connected thereto to a common output-/input lead, or conversely connecting a signal on said output/input lead to a desired one of said plurality of separate leads. The multiplexer is designed so that it can accommodate signals of much higher voltage than that of the logic supply rails used to energize and operate the circuitry. Normally, prior art multiplexers of this type have only been able to accommodate signals within the range of the logic circuit's supply voltage which is typically ±15 volts. The analog signal voltage range of the present multiplexer is limited only by the breakdown voltage of the FET transistors used in the signal processing (or output) channels, and hence can be many times the aforementioned range of the circuit supply voltage. Also, the circuit is designed to have an extremely low "on" resistance so that signals being processed do not suffer undue attenuation, and the "off" resistance is extremely high to prevent leakage between channels. Further, provision may be made for rapidly switching off a channel in response to a dump signal.

SUMMARY OF THE INVENTION

Electrical isolation between the control logic of the multiplexer and the signal channels is achieved by optical coupling in which an array of light emitting diodes (LEDs) equal in number to the number of input/output channels is controlled by the multiplexer logic so that the LED connected to a channel which is to be activated is switched "on" and the light emitted thereby is sensed by an array of photodiodes, hereinafter referred to as a photovoltaic cell, the output of which switches on a pair of series connected field effect transistors of the double diffused metal oxide semi-conductor (DMOS) type, which connect the input/output lead corresponding to that channel to the common input-/output lead. The switching off of an activated channel is accomplished by deactivating the LED of that channel. In addition, a dump pulse can be simultaneously arranged to initiate the discharge of voltage remaining on the parasitic gate-to-source capacitance of all of the DMOS transistors, thus greatly shortening the turnoff time of the activated channel.

It is thus an object of the invention to provide a novel multiplexer which is capable of handling signals several times larger in magnitude than the supply voltage thereof, and which includes low "on" resistance, high "off" resistance and can be rapidly switched on and off.

Another object of the invention is to provide a circuit capable of selectively connecting any desired one of a plurality of input/output leads to a common input/output lead, or vice versa, and wherein the magnitudes of the signals processed may be several times the supply voltages used to control said circuit, and in which said circuit provides extremely low "on" resistance coupled with extremely high "off" resistance.

A further object of the invention is to provide a high voltage multiplexer which uses a pair of series connected DMOS transistors to connect the input to the output of each channel, whereby an extremely low "on" resistance results, coupled with an extremely high resistance when said transistors are switched "off".

Another object is to provide a multiplexer utilizing DMOS transistors as the switching elements thereof and wherein said transistors are rapidly switched off by simultaneously removing the gate-to source voltage thereof and short-circuiting said gates to said sources to discharge any voltage across the interelectrode parasitic capacity thereof.

These and other objects and advantages of the invention will become apparent from the following detailed description and the drawings.

DETAILED DESCRIPTION OF A PREFERRED EMBODIMENT

Figure 1:
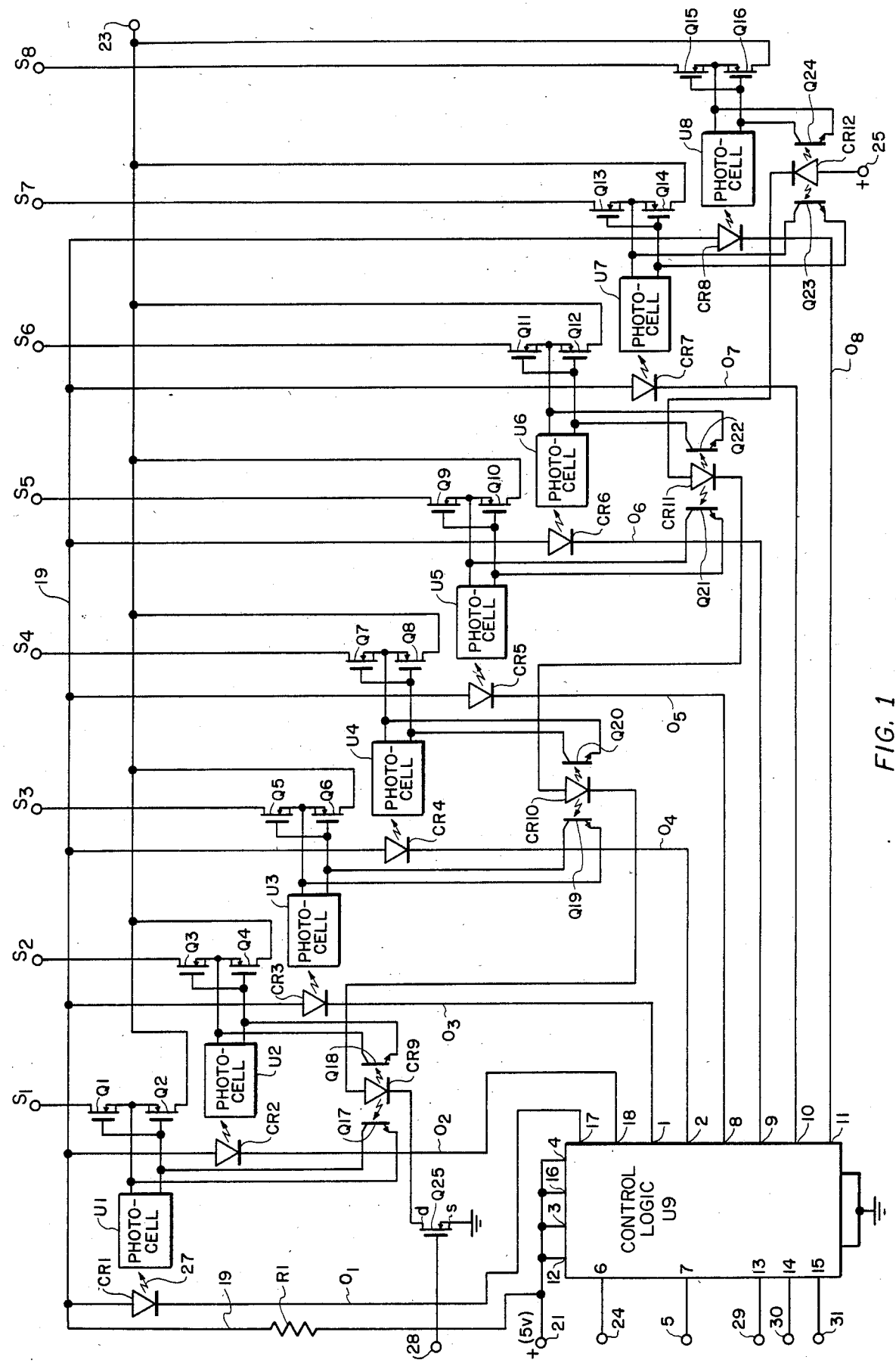
FIG. 1 is a circuit diagram of the multiplexer of the invention.

The circuit of FIG. 1 comprises an eight channel multiplexer comprising eight input/output terminals $S_1$ through $S_8$ and a common input/output terminal 23 which is connected to a different one of the eight terminals $S_1$–$S_8$ through eight different series-connected pairs of DMOS transistors, Q1 through Q16. For example, terminal 23 is connected to $S_1$ through the two series connected DMOS field effect transistors Q1 and Q2, and if Q1 and Q2 are conducting $S_1$ will be connected to terminal 23. Similarly 23 is connected to $S_2$ via Q3 and Q4, etc. As used in one embodiment, the circuit is arranged so that only one pair of the switching transistors Q1–Q16 is conducting or "on" at any time. The switching "on" and "off" of the eight channels of the multiplexer is controlled by the control logic chip U9 which functions as a 3 to 8 decoder with latched drive to control the multiplexer in accordance with externally applied control signals. Thus if the eight terminals $S_1$–$S_8$ are considered the input terminals, any signals applied thereto can be selectively applied one at a time to output terminal 23 to form a time division multiplexed signal for application to further circuitry. Also any signals sequentially applied thereto can be selectively switched to any desired one of the terminals $S_1$–$S_8$ under the control of the circuit.

Figure 2:
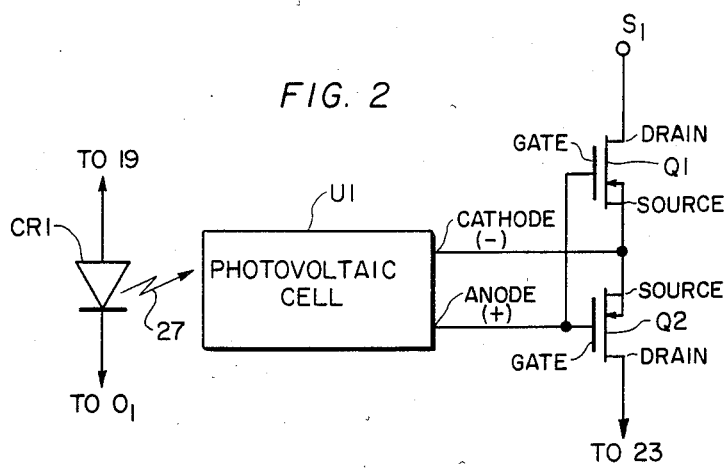
FIG. 2 is a portion of the circuit of FIG. 1 showing additional circuit details.
Figure 3:
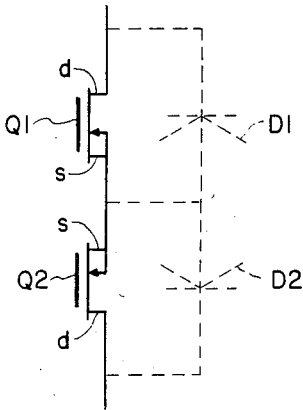
FIG. 3 illustrates the advantages of the use of two series-connected DMOS transistors as switching elements.

The switching transistors Q1–Q16 are isolated from the control circuitry by means of optical links comprising eight light emitting diodes (LEDs), CR1–CR8. The light emitted by LED CR1 is indicated at 27 and this light falls on and energizes a photocell U1 of the photovoltaic type which generates a voltage in response to applied light. FIG. 2 shows in greater detail the circuitry of each of the switching elements of the multiplexer. The anode of the photocell output is positive relative to its cathode, as shown in FIG. 2. The transistor Q1 has its drain connected to $S_1$, the sources of Q1 and Q2 are connected, and the drain of Q2 is connected to input/output terminal 23. The gates of the series-connected transistors are connected together and to the photocell anode, with the two connected transistor sources connected to the photocell cathode. Thus in the absence of any light the photocell output will be zero and Q1 and Q2 will both be switched off to provide a high impedance between $S_1$ and 23. With CR1 energized, the light thereof will produce a positive gate-to-source voltage for both transistors which will switch both "on" to connect $S_1$ to 23 by means of a very low resistance path. DMOS transistors were chosen for this circuit because of the very low resistance thereof when in the conducting state. Such transistors however have the disadvantage of having a path from the source to the drain which acts as a shunt diode with the anode thereof at the source, and the cathode thereof at the drain. In FIG. 3, these shunt diodes are represented by the symbols D1 and D2, connected across the transistors Q1 and Q2. If only a single DMOS transistor were used as the switching element in each channel of this multiplexer, a signal would pass through this shunt diode when the transistor is non-conducting whenever its source is positive relative to its drain by more than typically 0.7 volts. This signal would reach the output terminal and would distort the output at 23 by adding to the signal. This undesired distortion is eliminated according to one feature of the invention, by using two such DMOS transistors in series, with the sources thereof connected together, as shown in FIGS. 2 and 3, so that the aforementioned shunt diodes will have opposite polarity and will thus block both polarities of voltage appearing across the pair of transistors, to yield a high "off" resistance for both polarities.

All of the cathodes of the LEDs CR1-CR8 which control the switching "on" and "off" of the signal channels are connected via leads $O_1$-$O_8$ to eight different terminals on control logic chip U9. These terminals are labeled 17, 18, 1, 2, 8, 9, 10, and 11 for the leads $O_1$-$O_8$, respectively. All of the anodes of these eight LEDs are connected together and to lead 19 which is connected through resistor R1 to a source of positive voltage 21 which also provides operating potential to chip U9 via terminals 12, 3, 16 and 4. When a selected one of the eight channels is to be activated or rendered conductive, the control logic U9 will ground the desired LED cathode by grounding the lead $O_1$-$O_8$ which is connected thereto. As stated above, the control logic U9 comprises a 3 to 8 decoder which means that it can decode a three bit binary word to identify which one of the eight channels is to be activated. The three binary bits are applied to U9 from external circuitry from leads 29, 30 and 31 which are connected to chip terminals 13, 14 and 15. A pulse applied to terminal 6 from lead 24 causes the chip to read the code at the three terminals 13, 14 and 15 to activate the channel indicated thereby by grounding the appropriate LED cathode as explained above. The latching feature of the control logic maintains the selected channel "on", until a reset or clear pulse is received from lead 5 which is connected to chip terminal 7. The clear pulse releases the latching circuit and thus removes the ground from the LED of the activated channel and thus renders the DMOS transistors of that channel non-conducting.

Whenever a channel is switched "off" in this manner, the photocell of that channel will cease producing any voltage output as soon as its associated LED is extinguished. However, the inherent parasitic capacity between the gates and sources of the two transistors of that channel, across which the photocell output is applied, will tend to maintain the transistor "on" for a short period until the stored energy on this parasitic capacity is dissipated. This can result in undesirably long turn-off times. In accordance with a further feature of the invention, the voltage across this parasitic capacity is rapidly discharged by shorting the outputs of all of the photocells by means of bipolar photo-transistors which are rendered conductive by a plurality of LEDs, CR9-CR12. As can be seen from FIG. 1, these LEDs are all connected in series, with the anode of CR12 connected to positive voltage source 25 and the cathode of CR 9 connected to the drain of FET transistor Q25, the source of which is grounded, and the gate of which is connected to terminal 28. Each of the LEDs CR9-CR12 illuminates a pair of phototransistors, e.g., CR9 illuminates phototransistors Q17 and Q18, CR10 illuminates Q19 and Q20, CR11 illuminates Q21 and Q22, and CR12 illuminates Q23 and Q24. The collector to emitter circuit of each phototransistor shunts the output of the photocell of a different one of the multiplexer channels. Simultaneously with the application of the clear signal to U9 from lead 5, a positive dump control signal on lead 28 renders Q25 conductive and illuminates all four of the LEDs CR9-CR12. The phototransistors Q17-Q24 are then all rendered conductive to provide a short circuit to rapidly discharge the gate-to-source capacity of the channel which is being switched "off".

Figure 4:
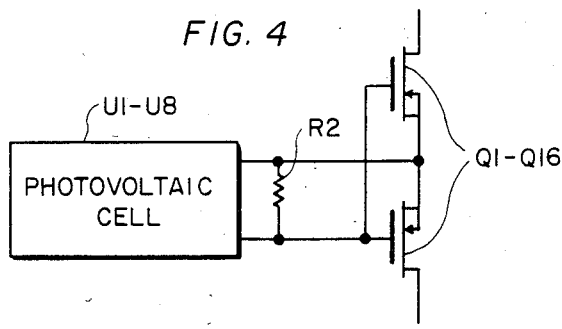
FIG. 4 shows a modification of a portion of the circuit of FIG. 1.

If a longer turn-off time can be tolerated, the phototransistors Q17-Q24 and their associated LEDs, can be replaced by fixed resistors connected across the output of each of the photovoltaic cells. FIG. 4 shows a resistor connected across a photocell output. The voltage across the gate-to-source capacity of the associated switching transistors will be discharged through this resistor.

A multiplexer of this type built by the inventors was capable of handling analog signals in the range of plus and minus 60 volts with an "on" resistance of 5 ohms. The use of other types of DMOS transistors could result in higher or lower voltage ranges and/or "on" resistance, depending on the application requirements.

While the invention has been described in connection with illustrative embodiments, obvious variations therein will be apparent to those skilled in the art and accordingly the invention should be limited only by the scope of the appended claims.

What is claimed is:

1. A high voltage multiplexer capable of selectively connecting any desired one of a plurality of input leads to a common output lead, comprising: a plurality of switching elements connected respectively between each of said plurality of input leads and said common output lead, said switching elements each including a pair of series-connected double diffused metal oxide semiconductor (DMOS) transistors having source, drain and gate electrodes and which are connected source-to-source and gate-to-gate, respective said input leads being connected to one respective drain electrode of each said pair, the other drain electrode of each pair being connected to said common output leads, a plurality of photovoltaic cells each connected across the gates and sources of respective pairs of DMOS transistors to control the output of said transistors, a first plurality of light emitting diodes each positioned adjacent a respective photovoltaic cell to selectively illuminate said cells, and control logic means selectively actuating said light emitting diodes in response to externally applied control signals, whereby said transistor pairs can be switched "on" one at a time.

2. The multiplexer of claim 1 wherein circuit means are connected across the output of said photovoltaic cells to rapidly discharge any voltage remaining on the gate-to-source capacity of said DMOS transistors upon switching "off" of any of said pairs.

3. The multiplexer of claim 2 wherein said circuit means includes a second plurality of light emitting diodes arranged to be illuminated upon the switching "off" of any of said pairs, and a plurality of phototransistors having their collector - emitter circuits shunted across the outputs of said photovoltaic cells, respective ones of said second plurality of light emitting diodes each illuminating respective said phototransistors to shunt the outputs of said photovoltaic cells.

4. The multiplexer of claim 2 wherein said circuit means includes a resistor connected across the output of each of said photovoltaic cells.

5. A high voltage multiplexer which has a low "on" resistance and a high "off" resistance, comprising: switching means including a plurality of pairs of series-connected double diffused metal oxide semiconductor (DMOS) transistors each pair being connected source-to-source and gate-to-gate, and including a pair of drain electrodes, a plurality of input leads each connected to respective ones of said drain electrodes, the other drain electrodes being connected together, optical means for switching said pairs of transistors "on" and "off", said optical means including a plurality of photovoltaic cells and a plurality of light emitting diodes, each of said diodes respectively illuminating one of said cells, the output of each of said cells being connected to and controlling a respective pair of said series connected DMOS transistors, a control logic circuit controlling said light emitting diodes, said logic circuit illuminating a selected one of said light emitting diodes in response to externally applied control signals, and means to rapidly discharge any voltage remaining on the gate-to-source capacity of said DMOS transistors upon the switching "off" of any of said transistor pairs.

6. The multiplexer of claim 5 wherein said means to rapidly discharge any remaining voltage includes a second plurality of light emitting diodes and a plurality of phototransistors, each of said second light emitting diodes being arranged to illuminate respective said phototransistors, the emitter-collector circuits of said phototransistors being connected across the output of respective said photovoltaic cells to shunt the outputs of said cells.

* * * * *